(12) United States Patent
Nakao (10) Patent No.: US 10,345,974 B2
(45) Date of Patent: Jul. 9, 2019

(54) TECHNIQUE FOR IMPROVING CAPACITANCE TYPE INPUT APPARATUS

(71) Applicant: CANON KABUSHIKI KAISHA, Tokyo (JP)

(72) Inventor: Kunihisa Nakao, Chigasaki (JP)

(73) Assignee: CANON KABUSHIKI KAISHA, Tokyo (JP)

(*) Notice: Subject to any disclaimer, the term of this patent is extended or adjusted under 35 U.S.C. 154(b) by 451 days.

(21) Appl. No.: 15/292,617

(22) Filed: Oct. 13, 2016

(65) Prior Publication Data
US 2017/0108966 A1    Apr. 20, 2017

(30) Foreign Application Priority Data
Oct. 14, 2015   (JP) .................. 2015-202912

(51) Int. Cl.
| G06F 3/045 | (2006.01) |
| G06F 3/044 | (2006.01) |
| G06F 3/041 | (2006.01) |
| G01R 27/26 | (2006.01) |

(52) U.S. Cl.
CPC ............ G06F 3/044 (2013.01); G06F 3/0418 (2013.01); G01R 27/2605 (2013.01); G06F 3/0416 (2013.01)

(58) Field of Classification Search
CPC ...... G06F 3/044; G06F 3/0418; G06F 3/0416; G01R 27/2605
See application file for complete search history.

(56) References Cited

U.S. PATENT DOCUMENTS

| 8,982,097 B1* | 3/2015 | Kuzo ................... G06F 3/0418 345/174 |
| 2015/0062058 A1* | 3/2015 | Chang .................... G06F 3/044 345/174 |
| 2016/0253039 A1* | 9/2016 | Heo ....................... G06F 3/0412 345/173 |

FOREIGN PATENT DOCUMENTS

| CN | 102023768 A | 4/2011 |
| CN | 103376967 A | 10/2013 |
| CN | 103677615 A | 3/2014 |
| CN | 103995626 A | 8/2014 |
| JP | 2010-002949 A | 1/2010 |

(Continued)

OTHER PUBLICATIONS

Notification of the First Office Action issued by the State Intellectual Property Office of P. R. China dated Dec. 28, 2018 in corresponding Chinese Patent Application No. 201610892753.7, with English translation.

(Continued)

Primary Examiner — Nelson M Rosario
Assistant Examiner — Andrew Lee
(74) Attorney, Agent, or Firm — Carter, DeLuca & Farrell LLP (57) ABSTRACT

A setting unit sets, if any measurement result of peripheral electrodes exceeds a threshold value, an accumulation number of each mutual-capacitance of intersection points, so that the accumulation number of an intersection point closer to a position of a conductor object is larger, and the accumulation number of an intersection point farther from the position of the conductor object is smaller. A setting unit sets, if all of the measurement results do not exceed the threshold value, the accumulation numbers of intersection points to be the same value.

15 Claims, 8 Drawing Sheets

(56) References Cited

FOREIGN PATENT DOCUMENTS

WO 2015016474 A1 2/2015

OTHER PUBLICATIONS

Japanese Office Action issued by the Japanese Patent Office dated Apr. 19, 2019 in corresponding Japanese Patent Application No. 2015202912, with English translation.

* cited by examiner

TECHNIQUE FOR IMPROVING CAPACITANCE TYPE INPUT APPARATUS

BACKGROUND OF THE INVENTION

Field of the Invention

The present invention relates to an input apparatus, a method for controlling an input apparatus, an electronic device including an input apparatus, a method of controlling an electronic device, a program,-and a storage medium.

Description of the Related Art

Capacitance type touch panels have been spreading as input apparatuses of smart phones and digital cameras. In capacitance types, a coordinate touched by a finger, a stylus pen or the like is specified based on a static capacitance between a plurality of column electrodes arranged in a column direction and a plurality of row electrodes arranged in a row direction. A contact area (planar dimension) of a finger or the like in relation to an electrode arranged at an edge of the touch panel is smaller than a contact area of a finger or the like in relation to an electrode arranged in the center vicinity of the touch panel. This is because while a part of the finger is touching the touch panel, the remaining part protrudes from the touch panel. Accordingly, the precision of the touch detection for electrodes arranged on the edge tends to be degraded. According to Japanese Patent Laid-Open No. 2010-2949, improving the precision of a touch detection by amplifying a detected signal of a touch panel by a current mirror circuit is proposed.

Touch panels are often stacked on a display apparatus such as a liquid crystal panel. Accordingly, noise of a drive signal for driving a liquid crystal panel or the like is amplified by the current mirror circuit of the touch panel, and the precision of the touch detection may be degraded.

SUMMARY OF THE INVENTION

The present invention precisely detects a touch in a vicinity of an edge of a touch panel.

The present invention provides an input apparatus comprising the following elements. A touch panel sensor has a plurality of column electrodes and a plurality of row electrodes arranged to intersect the plurality of column electrodes. A first measurement unit is configured to execute a self-capacitance measurement for each of a plurality of peripheral electrodes which are column electrodes and row electrodes arranged in a peripheral portion of the touch panel sensor out of the plurality of column electrodes and the plurality of row electrodes. A determination unit is configured to determine whether or not any measurement result of the plurality of peripheral electrodes measured by the first measurement unit exceeds a threshold value. A setting unit is configured to set, if any measurement result of the plurality of peripheral electrodes measured by the first measurement unit exceeds a threshold value, an accumulation number of each mutual-capacitance of a plurality of intersection points, which are formed by the plurality of column electrodes and the plurality of row electrodes intersecting, so that the accumulation number of an intersection point closer to a position of a conductor object estimated based on measurement results of the self-capacitance measurement is larger, and the accumulation number of an intersection point farther from the position of the conductor object is smaller, and set, if all of the measurement results of the plurality of peripheral electrodes measured by the first measurement unit do not exceed the threshold value, the accumulation numbers of the mutual-capacitances of each of the plurality of intersection points to be the same value. A second measurement unit is configured to execute a mutual-capacitance measurement for each of the plurality of the intersection points in accordance with the accumulation numbers set for each of the plurality of intersection points by the setting unit. A decision unit is configured to decide coordinates of the conductor object based on the measurement result of the mutual-capacitance measurement executed by the second measurement unit.

Further features of the present invention will become apparent from the following description of exemplary embodiments (with reference to the attached drawings).

DESCRIPTION OF THE EMBODIMENTS

<Touch Panel Configuration>

Figure 1:
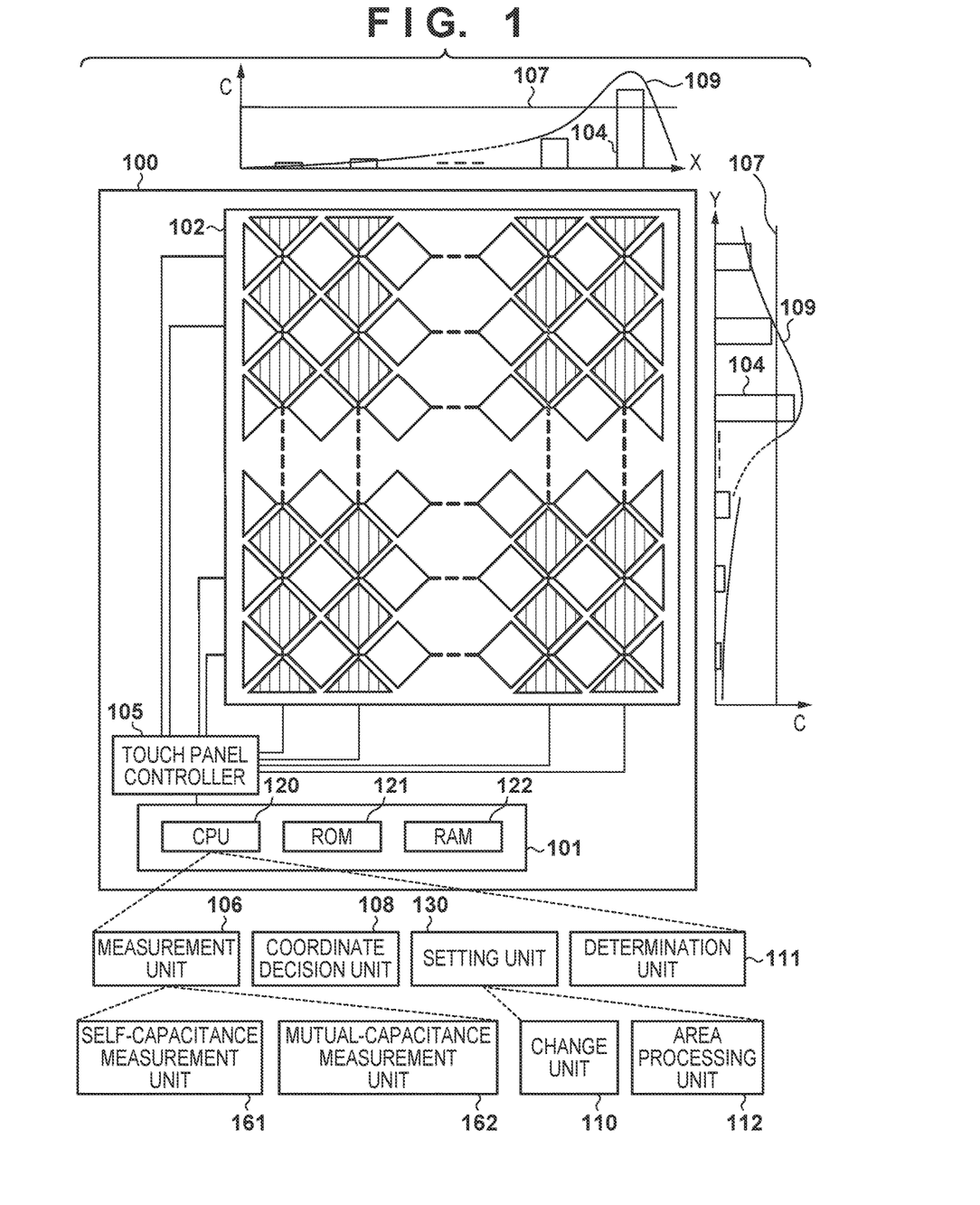
FIG. 1 is a block diagram for illustrating a configuration of an input apparatus.
Figure 2:
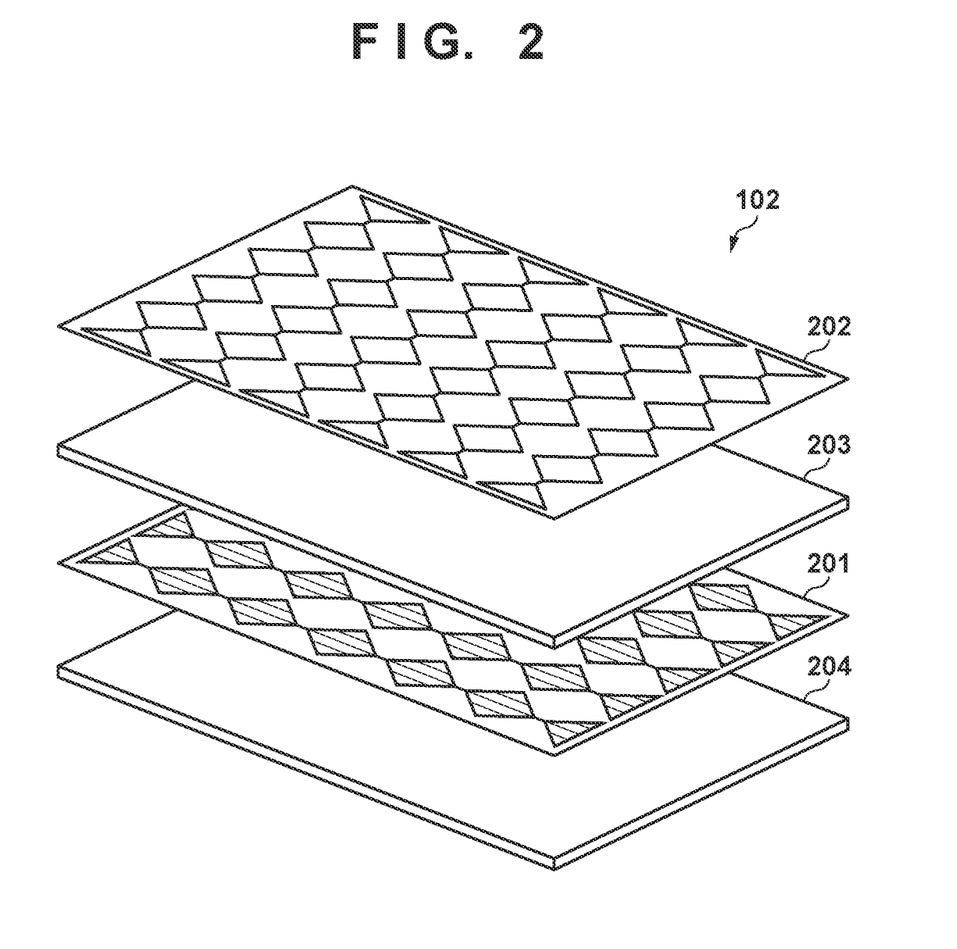
FIG. 2 is an exploded view for illustrating a touch panel sensor of a static capacitance type.
Figure 3:
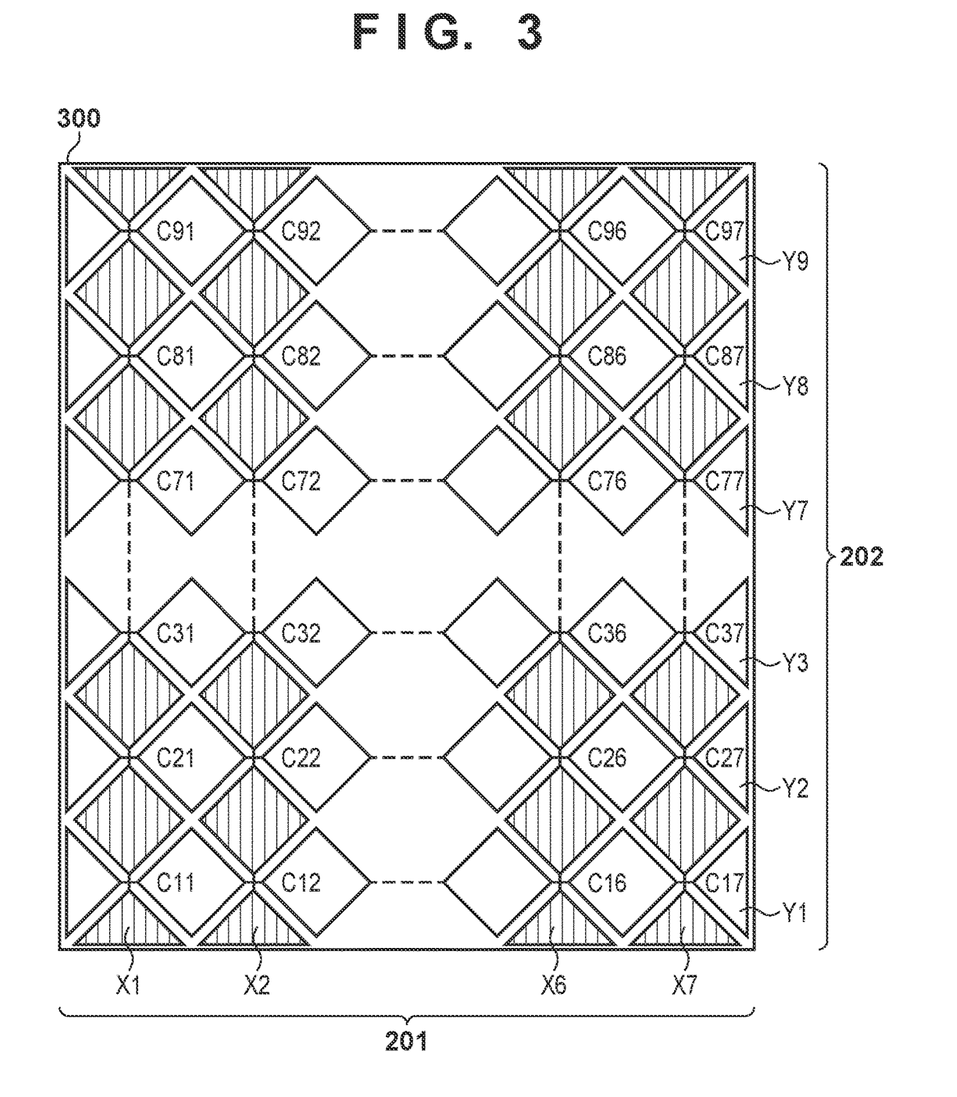
FIG. 3 is a view for illustrating an arrangement of electrodes and intersection points.

An explanation is given for an example of a configuration of an input apparatus 100 using FIG. 1-FIG. 3. A touch panel driver 101 executes driving of the input apparatus 100 and calculation of coordinates. The touch panel driver 101 may be configured by an ASIC (an application specific integrated circuit), or may be configured by a CPU 120, a ROM 121, and a RAM 122, as illustrated in FIG. 1. The CPU 120 functions as a measurement unit 106, a coordinate decision unit 108, a setting unit 130 and a determination unit 111 by executing a control program stored in the ROM 121. A touch panel controller 105 is a control unit for performing control of a static capacitance type touch panel sensor 102. The touch panel sensor 102 is a sensor for causing generation of a static capacitance 104 with a conductor object 103 such as a finger. The touch panel sensor 102 can be formed by stacking an X-sensor 201, a glass 203, a Y-sensor 202, and a protection film 204, as illustrated in FIG. 2. Note, a stacked structure is not limited to this. For example, a transparent member between the X-sensor 201 and the Y-sensor 202 may be omitted, or the protection film 204 may be changed to a glass. The X-sensor 201 includes a plurality of column electrodes (X-electrodes) arranged in an X direction. The Y-sensor 202 includes a plurality of row electrodes (Y-electrodes) arranged in a Y direction.

As illustrated in FIG. 1, the column electrodes and the row electrodes are arranged so that they are intersecting (for example, orthogonal). A portion at which a column electrode and a row electrode orthogonally intersect is called an intersection point, and it is a reference of a coordinate. A self-capacitance measurement and a mutual-capacitance measurement are methods for detecting a contact or a closeness of the touch panel sensor 102 by the conductor object 103. In the self-capacitance measurement, the touch panel controller 105 supplies a drive signal in order to each column electrode in the X-sensor 201, and detects static capacitance of each column electrode. Similarly, the touch panel controller 105 supplies a drive signal in order to each row electrode in the Y-sensor 202 and detects static capacitance of each row electrode. That is, the static capacitance (self-capacitance) is measured for each electrode. Note, a drive signal (driving current) is supplied from one terminal of each electrode, a voltage that occurs at the other terminal of the respective electrode is measured, and the measured voltages are converted into static capacitance. Furthermore, a difference between the converted static capacitance and a default static capacitance when the touch panel sensor 102 is not contacted by or close to the conductor object 103 may be obtained as a change amount. The touch panel driver 101 decides a coordinate of an intersection point of a column electrode and a row electrode for which the amount of change of the static capacitance is large to be a coordinate of a position where there is a contact or a closeness of the conductor object 103. Alternatively, the touch panel driver 101 may decide the coordinate of the position where there is a contact or a closeness of the conductor object 103 by obtaining a centroid 109 in the X direction and a centroid 109 in the Y direction using the amount of change of the static capacitance. In a mutual-capacitance measurement, the touch panel controller 105 decides a coordinate of a touched position by scanning only either the X-sensor 201 or the Y-sensor 202 and detecting the change amount of static capacitances of intersection points at that time.

The static capacitance 104 of each row electrode is illustrated as a graph on the top side of the touch panel sensor 102 and the static capacitance 104 of each column electrode is illustrated as a graph on the right side of the touch panel sensor 102 in FIG. 1. The ordinate axis of these graphs illustrates the static capacitance and the abscissa axis illustrates the position of the electrode.

The measurement unit 106 is a unit that cooperates with the touch panel controller 105 to measure the static capacitance of the touch panel sensor 102. A self-capacitance measurement unit 161 is a unit for executing a self-capacitance measurement for each of a plurality of peripheral electrodes. The peripheral electrodes are column electrodes and row electrodes arranged on a peripheral portion of the touch panel sensor 102 out of the plurality of the column electrodes and the plurality of the row electrodes. For example, in a case where the X-sensor 201 is configured by column electrodes X1 to Xn and the Y-sensor 202 is configured by row electrodes Y1 to Ym, the outermost electrodes are the column electrodes X1 and Xn, and the row electrodes Y1 and Ym. A mutual-capacitance measurement unit 162 is a unit for executing a mutual-capacitance measurement for each of the plurality of intersection points. Note, mutual-capacitance is a very small amount compared to self-capacitance, so the mutual-capacitance measurement unit 162 executes a plurality of measurements and accumulates the measurement results. The accumulation number is set by the setting unit 130. The accumulation number is the number of times that accumulation is performed.

The determination unit 111 is a unit for determining the existence or absence of a touch (contact or closeness) to a peripheral electrode based on the measurement result of the self-capacitance measurement, or determining the existence or absence of touch to one of electrodes of the touch panel sensor 102 based on the measurement result of the mutual-capacitance measurement. The determination unit 111 determines that the electrode is touched for example if the static capacitance 104 for an electrode exceeds a detection threshold 107. The determination unit 111 determines that an electrode is not touched for example if the static capacitance 104 for the electrode does not exceed the detection threshold 107.

The coordinate decision unit 108 calculates the centroid 109 for each of the static capacitance 104 of the respective column electrodes and the static capacitance 104 of the respective row electrodes, and decides the centroid 109 of the X-sensor 201 and the centroid 109 of the Y-sensor 202 as coordinates of a touch position. In a case where the electrode arrangement of the touch panel sensor 102 is of two or more dimensions, the centroid 109 is calculated for each axis (dimension).

The setting unit 130 is a unit for setting the accumulation number applied to each intersection point. A change unit 110 is a unit for changing the accumulation number of each intersection point. In particular, in the mutual-capacitance measurement, the amount of change of the static capacitance of each intersection point is measured over a plurality of times, and the measurement results are accumulated. If a touch position estimated based on the self-capacitance measurement is in a vicinity of the peripheral electrodes, the change unit 110 sets the accumulation numbers of the mutual-capacitance of each intersection point to be approximately proportional to the distance from the touch position to the respective intersection point. Meanwhile, if the touch position estimated based on the self-capacitance measurement is not in a vicinity of the peripheral electrodes, the change unit 110 sets the accumulation numbers of the mutual-capacitance of each intersection point to be the same number (the initial value). In this way, the precision of a touch detection for an intersection point close to an edge of the touch panel sensor 102 is improved by changing the accumulation number. An area processing unit 112 classifies each intersection point into a plurality of areas (regions) in accordance with a touch position estimated by the self-capacitance measurement. The change unit 110 sets the accumulation numbers of the intersection points belonging to each area according to the areas classified by the area processing unit 112. That is, the same accumulation number is applied for a plurality of the intersection points belonging to the same area.

The intersection points of the touch panel sensor 102 are explained using FIG. 3. An electrode arrangement region 300 is a region where the X-sensor 201 and the Y-sensor 202 are arranged in the touch panel sensor 102. The shape of the electrode pad and the number of electrodes in the X-sensor 201 and the Y-sensor 202 are selected in order to obtain the required static capacitance 104 in accordance with the size of the touch panel sensor 102. In the present embodiment, the X-sensor 201 comprises of the 7 column electrodes X1 to X7 and the Y-sensor 202 comprises of the 9 row electrodes Y1 to Y9. As illustrated in FIG. 3, the 63 intersection points C11-C97 are arranged in the present embodiment. Here, Cji represents the intersection point of the column electrode Xi and the row electrode Yj. i and j are indexes for indicating the number of an electrode. The touch panel controller 105 measures the static capacitance 104 for each of the row electrodes Y1-Y9 and the column electrodes X1-X7 when the measurement unit 106 is instructed to make a self-capacitance measurement. Also, the touch panel controller 105 measures the amount of change of the static capacitance for each of the intersection points C11-C97 when the measurement unit 106 is instructed to make a mutual-capacitance measurement. The measurement results in the touch panel controller 105 is information of voltage, so it is converted from voltage to static capacitance in the measurement unit 106.

Figure 4:
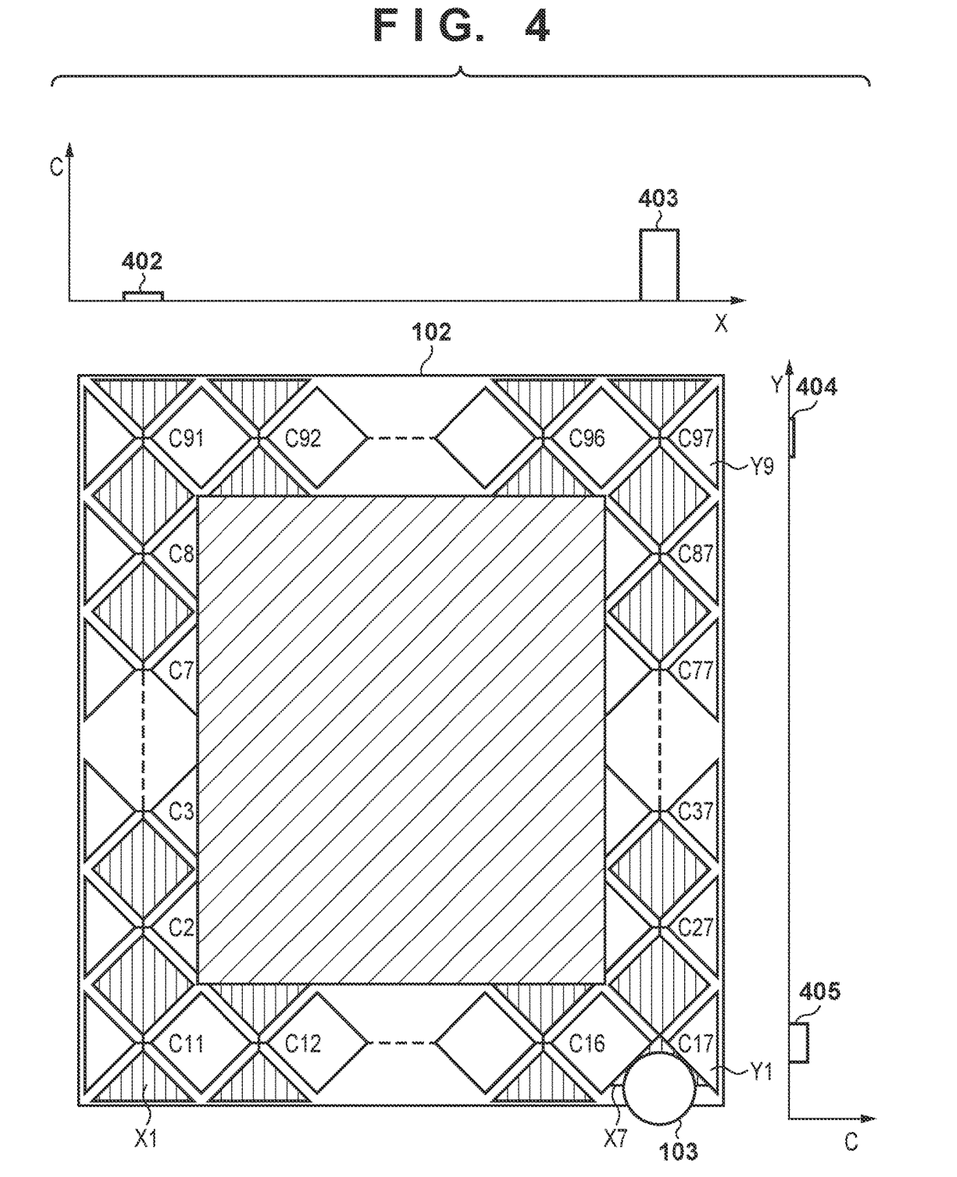
FIG. 4 is a view for illustrating an amount of change of a static capacitance relating to a peripheral electrode measured by a self-capacitance measurement.

The amount of change of the static capacitance according to the self-capacitance measurement in a case where the conductor object 103 is touching a peripheral electrode is explained using FIG. 4. The conductor object 103 contacts or is close to each of the row electrode Y1 and the column electrode X7 which are peripheral electrodes as illustrated in FIG. 4. Note, only a portion of the conductor object 103 contacts the touch panel sensor 102 and another portion is positioned on the exterior of the touch panel sensor 102, because the conductor object 103 is positioned on the edge of the touch panel sensor 102. This leads to a decrease in the static capacitance.

The touch panel driver 101 measures the static capacitance of each of the column electrodes X1 and X7 and the row electrodes Y1 and Y9 arranged in the peripheral portion of the touch panel sensor 102 by executing the self-capacitance measurement. These measurement results are illustrated as the static capacitances 402, 403, 404, and 405 in FIG. 4.

In the self-capacitance measurement, static capacitance can be measured for only one electrode. Therefore, even if the entirety of the conductor object 103 is not included in the electrode arrangement region 300, the capacitance variation indicating the existence of the conductor object 103 is apparent in the static capacitance 403 of the column electrode X7 and the static capacitance 405 of the row electrode Y1.

For example, the determination unit 111 determines that the conductor object 103 is contacting or close to a peripheral electrode because the static capacitance 405 exceeds the detection threshold 107. Note, the determination unit 111 may estimate that the conductor object 103 is contacting on the line of the column electrode X7, because the amount of change of the static capacitance 403 of the column electrode X7 is the largest between the static capacitance 402, 403, 404, and 405. Such a touch position estimation based on the self-capacitance measurement may be executed by the coordinate decision unit 108 or the setting unit 130. Next, the determination unit 111 estimates that the conductor object 103 exists in the vicinity of the row electrode Y1 because there is also a significant capacitance variation in the static capacitance 405 of the row electrode Y1. However, the amount of change of the static capacitance 405 of the row electrode Y1 is smaller than the detection threshold 107, so the determination unit 111 estimates that the conductor object 103 is positioned on the exterior of the touch panel sensor 102 or is positioned on the side of the row electrode Y2. The determination unit 111 estimates that the conductor object 103 is not contacting to the column electrode X1 or the row electrode Y9 because no significant change is generated in the static capacitance 402 of the column electrode X1 or the static capacitance 404 of the row electrode Y9.

From the total of these estimation results, the determination unit 111 decides the vicinity of the intersection point C17 to be a first candidate for the position of the conductor object 103. Also, the determination unit 111 decides the intersection points C16, C26, and C27 adjacent to the intersection point C17 and the vicinity of the intersection points C27, C37, . . . , C87, and C97 according to the column electrode X7 to be second candidates. Also, the determination unit 111 decides the intersection points C11, C12, . . . , and C15 according to the row electrode Y1 to be third candidates.

<Flowchart>

Figure 5:
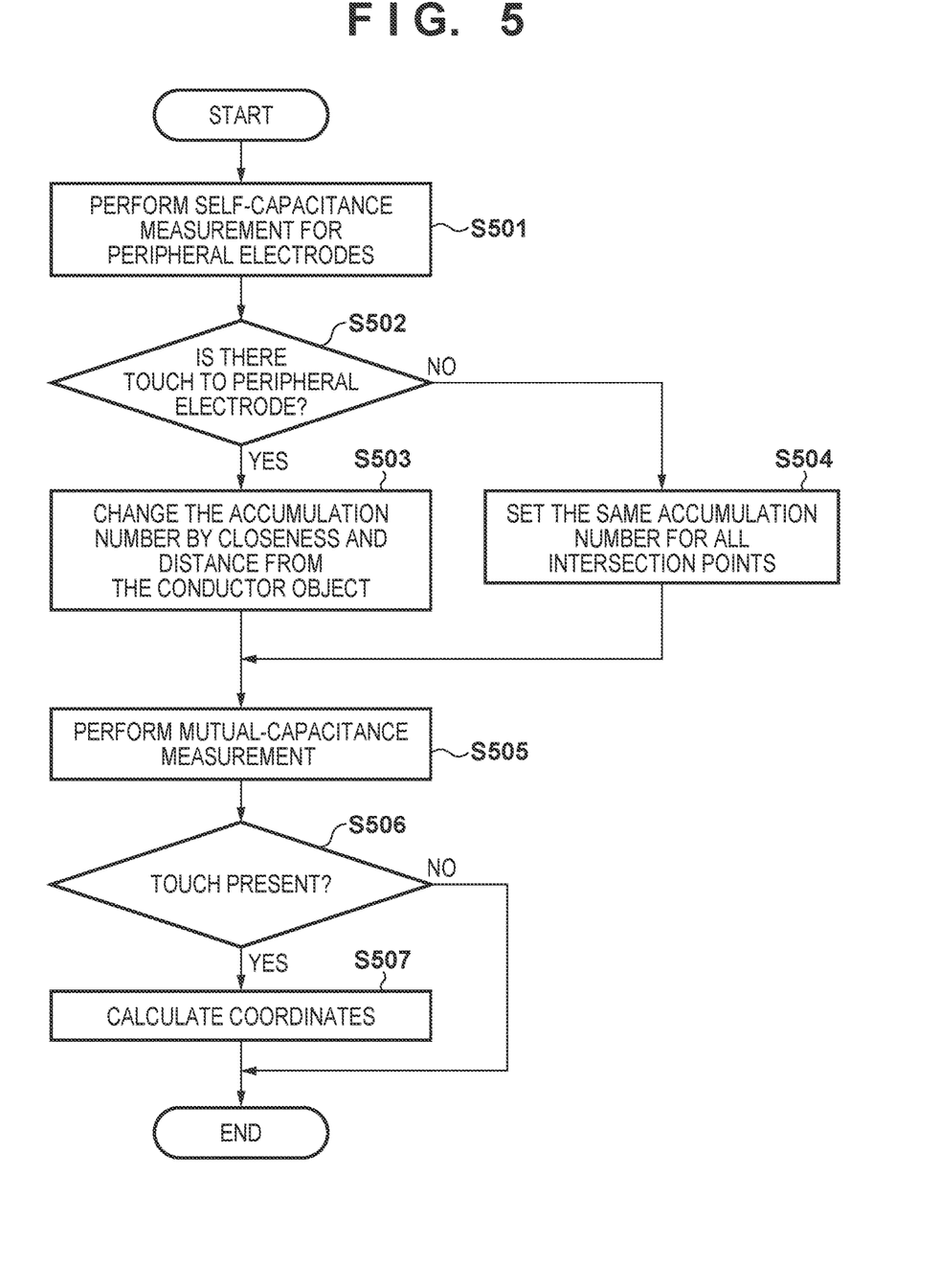
FIG. 5 is a flowchart for illustrating coordinate decision processing.

Touch position coordinate decision processing is explained using FIG. 5. Note, the CPU 120 functions as each kind of unit by loading a control program stored in the ROM 121 into the RAM 122 and executing it.

In step S501, the self-capacitance measurement unit 161 measures each of the static capacitances 402-405 of the electrodes X1, X7, Y9, and Y1 arranged in the peripheral portion of the touch panel sensor 102 by the self-capacitance measurement. The static capacitance 402-405 may also be for example the difference (the amount of change) between the static capacitance measured in a status where the conductor object 103 is not contacting or close to the touch panel sensor 102 and the measured static capacitance.

In step S502, the determination unit 111 determines whether or not there is a touch to a peripheral electrode based on the measurement results of the static capacitances 402-405. For example, the determination unit 111 determines that there is a touch to a peripheral electrode if one of the static capacitances 402-405 exceeds the predetermined detection threshold value (touch threshold value). Meanwhile, the determination unit 111 determines that there is no touch to a peripheral electrode if all of the static capacitances 402-405 do not exceed the predetermined detection threshold value. In a case where there is a touch to a peripheral electrode, the touch panel driver 101 advances to step S503.

In step S503, the setting unit 130 performs change setting of the accumulation number for each intersection point C11-C97. For example, the area processing unit 112 decides the vicinity area of the conductor object 103 based on the result of the self-capacitance measurement for the peripheral electrodes. The change unit 110 sets the accumulation number of each intersection point belonging to the vicinity area to be relatively large and sets the accumulation number of the intersection points belonging to areas far from the conductor object 103 to be relatively small. However, the total value of the accumulation numbers of all intersection points may be always kept constant. With this, the measurement time required for the mutual-capacitance measurement of all intersection points can be kept constant. If the measurement time required for the mutual-capacitance measurement becomes longer, the time for finalizing coordinates after a user performs a touch also becomes longer, and so the user will feel as though the response to the touch is slow. Accordingly, the accumulation number of each intersection point is increased or decreased individually, but the total value of the accumulation numbers of all intersection points is kept constant. Therefore, it is possible to improve the detection precision for a touch on the peripheral portion without impairing the usability. Keeping the total value of the accumulation number of all intersection points to be always a constant is optional.

In a case where a touch to a peripheral electrode is not detected in step S502, the touch panel driver 101 advances to step S504. In step S504, the setting unit 130 sets the same accumulation number (initial value) for all intersection points. This accumulation number is for example an initial value set at design time of the input apparatus 100 in accordance with a sensitivity of the touch panel sensor 102 or the like.

In step S505, the mutual-capacitance measurement unit 162 executes the mutual-capacitance measurement via the touch panel controller 105. For example, the mutual-capacitance measurement unit 162 executes the mutual-capacitance measurement for all of intersection points C11-C97 in accordance with the accumulation numbers set for each intersection point C11-C97 by the setting unit 130. If the estimated position of the conductor object 103 based on the self-capacitance measurement is in a vicinity of a peripheral electrode, the accumulation number set in the change is applied. If the estimated position of the conductor object 103 is not in a vicinity of a peripheral electrode, a uniform accumulation number is applied.

In step S506, the determination unit 111 determines whether or not the conductor object 103 is touching the touch panel sensor 102 based on the amount of change of the static capacitance measured in each intersection point C11-C97. For example, the determination unit 111 determines whether or not any of the change amounts of the static capacitances measured in each intersection point C11-C97 exceeds the detection threshold 107. If one of the change amounts of the static capacitances measured at the respective intersection points C11-C97 exceeds the detection threshold 107, the determination unit 111 determine "touch present" and the processing proceeds to step S507. On the other hand, if all of the change amounts of the static capacitances measured at the respective intersection points C11-C97 do not exceed the detection threshold 107, the determination unit 111 determine "no touch", and step S507 is skipped.

In step S507, the coordinate decision unit 108 calculates the coordinates based on the amount of change of the static capacitance of the intersection point in a vicinity of the detected touch. For example, as explained using FIG. 1, the coordinates are decided by calculating the centroid 109 of the amount of change of the static capacitances of the X-sensor 201 and the centroid 109 of the amount of change of the static capacitances of the Y-sensor 202. The touch panel driver 101 outputs a signal (touch-on signal) indicating that a touch is detected and the calculated coordinates (touch position data) to an exterior.

<Effect>

Figure 6A:
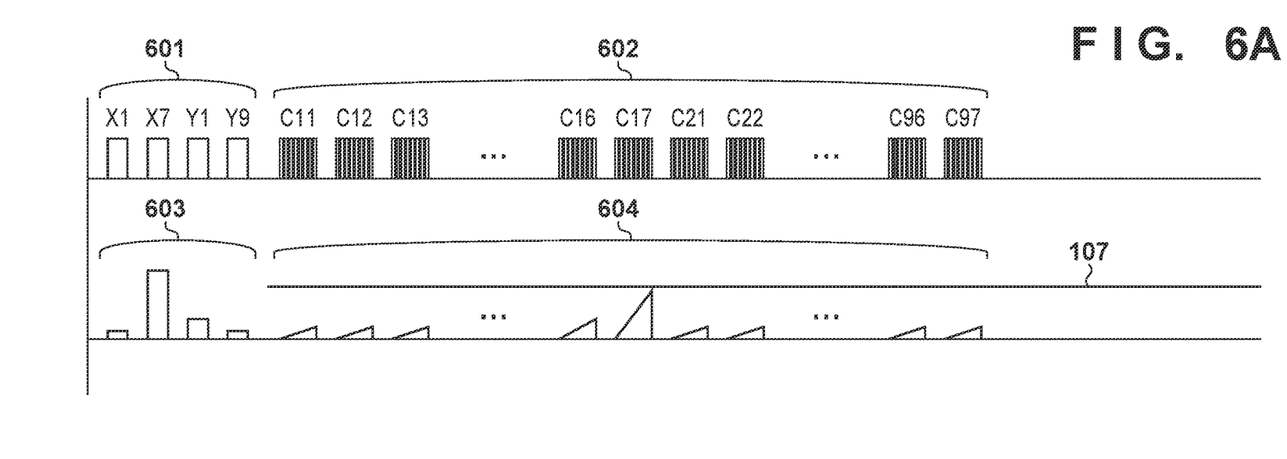
FIGS. 6A and 6B are views for illustrating a relation between an accumulation number and an accumulated value of a measurement result in a mutual-capacitance measurement.
Figure 6B:
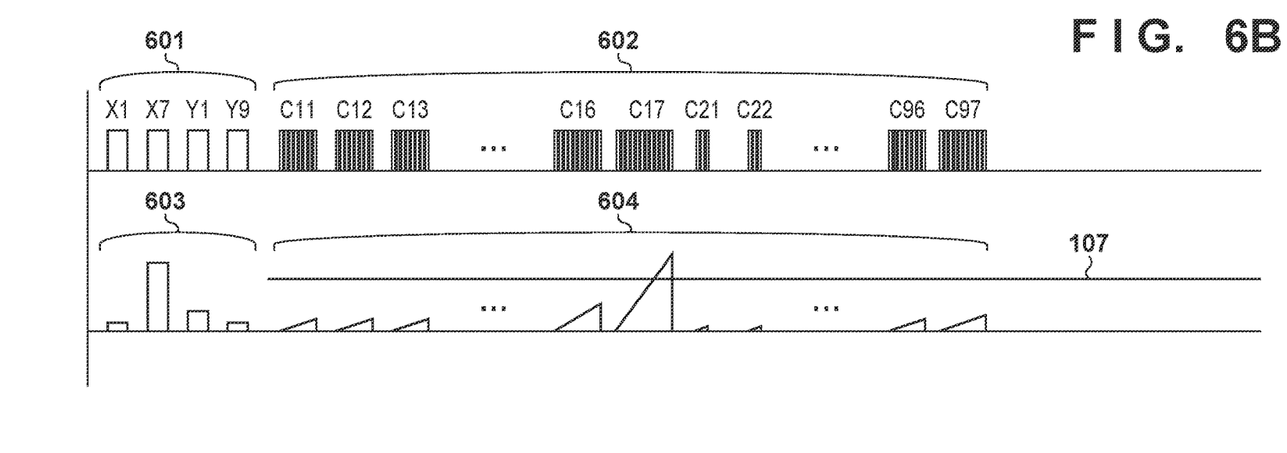

FIG. 6A illustrates a relation between the accumulation number and the amount of change of the static capacitance in a comparative example. Note, because an estimation of the touch position of the conductor object 103 based on the self-capacitance measurement is not executed in the comparative example, the accumulation number of each intersection point is set to be always uniform. FIG. 6B illustrates a relation between the accumulation number and the amount of change of the static capacitance in the present embodiment. In FIG. 6A and FIG. 6B, 601 indicates execution timing of the self-capacitance measurement. 602 indicates execution timing of the mutual-capacitance measurement. 603 indicates the amount of change of the static capacitance measured by the self-capacitance measurement. 604 indicates the amount of change of the static capacitance measured by the mutual-capacitance measurement.

As illustrated in FIG. 6A, the amount of change of the static capacitance of the intersection point C17 does not exceed the detection threshold 107 in the input apparatus of the comparative example even if the conductor object 103 is touching the column electrode X7 and the row electrode Y1. This is because the accumulation number of each intersection point is set to be uniform. Also, such a situation easily occurs when the contact area of the conductor object 103 on the touch panel sensor 102 is small. Accordingly, in the comparative example, the detection accuracy of a touch on the peripheral portion of the touch panel sensor 102 is low.

In contrast to this, as illustrated in FIG. 6B, the detection accuracy of a touch of the conductor object 103 in the vicinity of a intersection point on the peripheral portion is improved in the input apparatus 100 according to embodiments, because the accumulation number for the intersection point on the peripheral portion is set to be relatively larger. Also, in the input apparatus 100, uniform touch detection accuracy across the entire touch panel sensor 102 is more easily realized.

<Area Division (Classification) Method>

Figure 7:
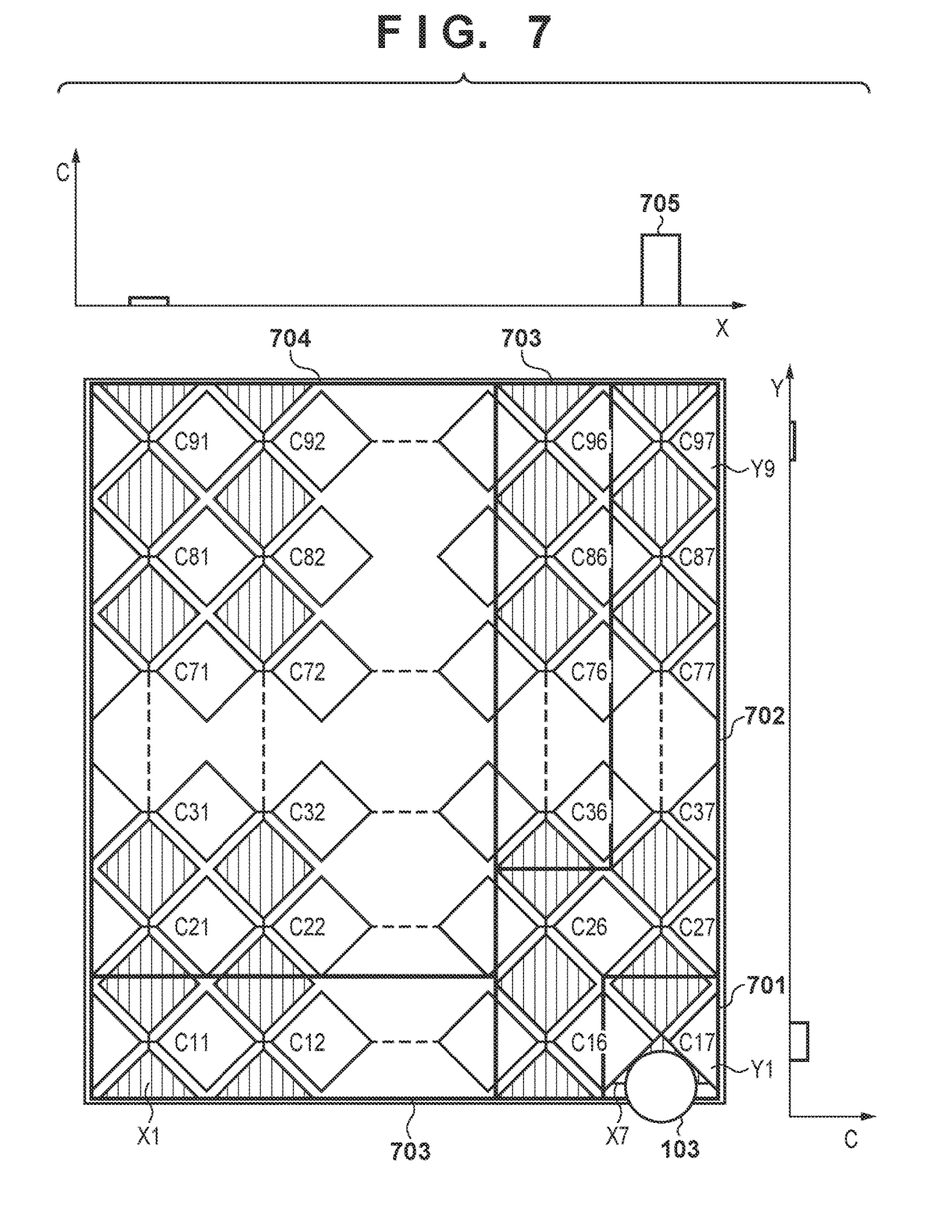
FIG. 7 is a view for illustrating an example of area processing.

FIG. 7 illustrates an example of a method of dividing areas by the area processing unit 112. The change unit 110 may set the accumulation number in accordance with a distance from the touch position of the conductor object 103, which is estimated based on the self-capacitance measurement, to the respective intersection point. Also, the area processing unit 112 may divide the entire touch panel sensor 102 into a plurality of areas based on the distances from the candidate position of the conductor object 103 to the respective intersection points or the amount of change of the static capacitance of the peripheral electrode. In such cases, the change unit 110 increases/decreases the accumulation number for each area divided by the area processing unit 112.

According to FIG. 7, the area processing unit 112 decides the area of a vicinity of the intersection point C17 as a first area 701 where the conductor object 103 may be located. The first area 701 is an area basically including only one intersection point. The area processing unit 112 decides an area including the intersection points C16, C26 and C27 which are adjacent to the intersection point C17 to be a second area 702. Note, in the present embodiment, the amount of change of the static capacitance 705 for the column electrode X7 is noticeably large (exceeding the threshold value), so the area processing unit 112 also classifies the intersection points C27, C37, . . . , C87, and C97 according to the column electrode X7 to be the second area 702. The area processing unit 112 decides an area including the intersection points C11, C12, . . . , and C15 according to the row electrode Y1 to be a third area 703, because the intersection point C17 is a portion of the row electrode Y1. Note, the intersection points C36, . . . , C96 and the like, which are adjacent to the second area 702, are also classified into the third area 703. The remaining intersection points are classified into the fourth area 704.

The change unit 110 sets the accumulation number of the first area 701 which is close to the conductor object 103 to be large, and sets the accumulation number of the fourth area 704 which has the farthest position to be the smallest. Note, the total value of the accumulation numbers of all intersection points may be limited to a constant value. This limitation is only required if the coordinate decision time is to be kept constant.

<One Example of Electronic Device>

Figure 8:
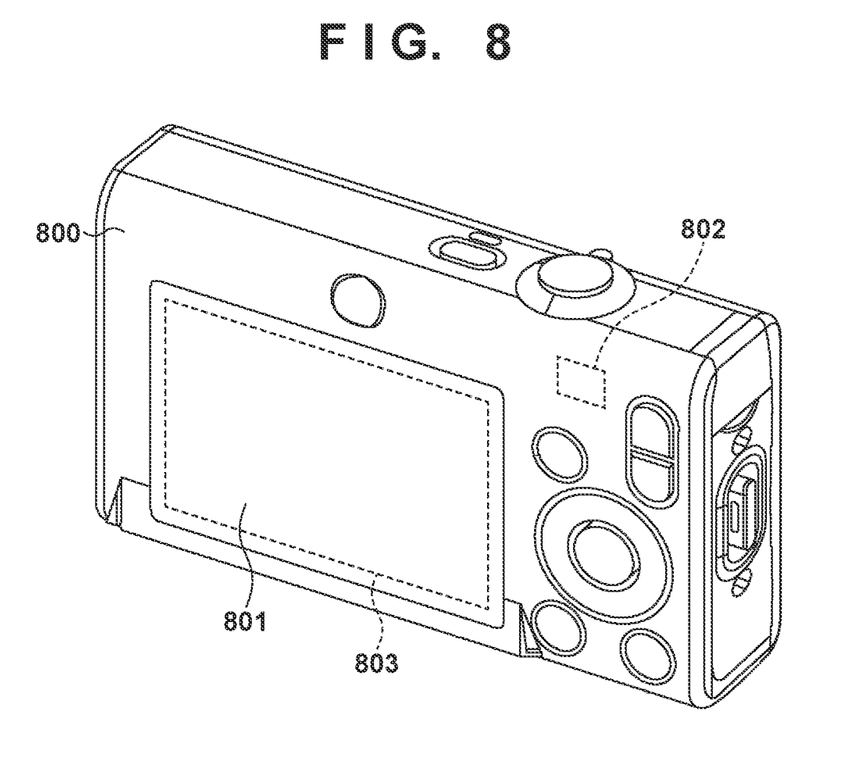
FIG. 8 is a view for illustrating an example of an electronic device.

FIG. 8 illustrates an electronic device 800 equipped with the input apparatus 100. An example of the electronic device 800 is a digital still camera. An operation unit 801 is formed on a display apparatus 803 by the touch panel sensor 102 of the input apparatus 100 being stacked. In addition to the touch panel driver 101 or the touch panel controller 105 described above, a main control unit 802 of the electronic device 800 or the like is arranged in the housing of the electronic device 800. The main control unit 802 causes the display apparatus 803 to display an image (live view) obtained by capturing an object. The user touches the touch panel sensor 102 of the operation unit 801 on a portion displaying an object to be focused. The main control unit 802 obtains the coordinates of the position where the finger of the user touches from the input apparatus 100 and functions as an execution unit for executing processing in accordance with the coordinates of the finger. For example, the main control unit 802 executes focus control so that a contrast of a subject image positioned at the obtained coordinate becomes higher. By applying the input apparatus 100 in the present embodiment to the electronic device 800, a touch by a finger of the user is enabled to be detected precisely across the entire surface of the touch panel sensor 102.

Note, the electronic device 800 may also be a computer such as a smart phone. For example, the touch-on signal and the touch position data are notified from the input apparatus 100 to a main control unit of the electronic device 800 which the input apparatus 100 is connected to or embedded into. In accordance with this notification, the main control unit of the electronic device 800 into which the input apparatus 100 is embedded executes a predetermined function accompanying the conductor object 103 touching the touch panel sensor 102. For example, if a touch icon is displayed on a touched position, the main control unit executes a function of the touch icon. For example in a case where a touch icon to which a function for activating specific application software is allocated is touched, the main control unit activates the specific application software. In this way, by making the accumulation number different in the vicinity of and far from the conductor object 103, the detection accuracy of a touch on the peripheral portion is improved.

<Summary>

As explained using FIG. 1-FIG. 3, the touch panel sensor 102 is one example of the touch panel sensor having a plurality of column electrodes and a plurality of row electrodes arranged to intersect the plurality of column electrodes. The self-capacitance measurement unit 161 is one example of a first measurement unit for executing a self-capacitance measurement for each of a plurality of peripheral electrodes which are column electrodes and row electrodes arranged in a peripheral portion of the touch panel sensor 102 out of a plurality of column electrodes and a plurality of row electrodes. The determination unit 111 is one example of a determination unit for determining whether or not one of measurement results of the plurality of peripheral electrodes measured by the self-capacitance measurement exceeds a threshold value. Note, in a case where one of the measurement results of the plurality of peripheral electrodes measured by the self-capacitance measurement exceeds the threshold value, the conductor object 103 is likely to contact or be close to a peripheral electrode. Therefore, the setting unit 130 performs a setting for changing the accumulation number of each mutual-capacitance of a plurality of intersection points formed by the plurality of column electrodes and the plurality of row electrodes intersecting with each other. As described above, the setting unit 130 sets the accumulation number of each mutual-capacitance of the plurality of intersection points so that the accumulation number of an intersection point closer to the position of the conductor object 103 estimated based on the measurement result of the self-capacitance measurement is larger, and the accumulation number of an intersection point farther from the position of the conductor object 103 is smaller. Meanwhile, in a case where all of the measurement results of the plurality of peripheral electrodes measured by the self-capacitance measurement do not exceed the threshold value, the conductor object 103 is less likely to be contacting or close to a peripheral electrode. Therefore, the setting unit 130 sets the accumulation number of each mutual-capacitance of the plurality of intersection points to be the same value. The mutual-capacitance measurement unit 162 is one example of a second measurement unit for executing a mutual-capacitance measurement for each of the plurality of intersection points in accordance with accumulation numbers set for each of the plurality of intersection points by the setting unit 130. The coordinate decision unit 108 is one example of a decision unit for deciding coordinates of the conductor object 103 based on the measurement result of the mutual-capacitance measurement executed by the mutual-capacitance measurement unit 162. In this way, it is possible to detect a touch in a vicinity of an edge of the touch panel sensor 102 precisely in accordance with this embodiment.

The setting unit 130 may set each accumulation number of the plurality of intersection points in accordance with the distance from the estimated position to the plurality of intersection points respectively, in a case where one of the measurement results of the plurality of peripheral electrodes measured by the self-capacitance measurement unit 161 exceeds the threshold value. The estimated position is a position of the conductor object estimated based on the measurement result of the self-capacitance measurement. Based on experience, the actual position of the conductor object 103 is close to the estimated position based on the measurement result of the self-capacitance measurement. Thus, it is possible to detect even a touch in a vicinity of the peripheral electrode precisely using the mutual-capacitance measurement by increasing the accumulation number of an intersection point close to the estimated position.

The setting unit 130 may decide the accumulation number of each intersection point based on a weight for the respective intersection point. For example, the change unit 110 of the setting unit 130 may adjust the weight of each intersection point in accordance with the distance from the estimated position of the conductor object 103 to the respective intersection point and set the accumulation number of the respective intersection point by multiplying the weight by the initial value of the accumulation number.

The CPU 120 may function as a conversion unit for converting the measurement result of the self-capacitance measurement into a contact area of the conductor object 103 to the touch panel sensor 102. In such a case, the setting unit 130 may further adjust the weight that is adjusted in accordance with the distance in accordance with the contact area of the conductor object 103. The contact area changes in accordance with the size of a finger, which is the conductor object 103, or the position of the finger. The contact area corresponds to an area of a polar plate of a condenser formed by the conductor object 103 and the touch panel sensor 102. Accordingly, when the contact area becomes small, the static capacitance also becomes small and the detection accuracy of a touch may be lower. Accordingly, the accumulation number may be adjusted so that the smaller the contact area of the conductor object 103 becomes, the larger the accumulation number becomes.

As explained using FIG. 7, in a case where one of the measurement results of a plurality of the peripheral electrodes measured by the self-capacitance measurement unit 161 exceeds the threshold value, the area processing unit 112 may function as a classification unit. That is, the area processing unit 112 functions as a classification unit for classifying a plurality of intersection points into a plurality of areas in accordance with the respective distances to the plurality of intersection points from the estimated position that is based on the measurement result of the self-capacitance measurement. In such cases, the change unit 110 sets the accumulation number for each area classified by the area processing unit 112. By applying such division into areas, the setting of the accumulation number may be simplified.

Note, the change unit 110 may set the same accumulation number for intersection points belonging to the same area. With this, the setting of the accumulation number will be further simplified.

As explained using FIG. 7, the area processing unit 112 may classify an area including the intersection point closest to the estimated position of the conductor object 103 out of the plurality of intersection points as the first area which has the largest accumulation number. The area processing unit 112 may classify an area including a plurality of intersection points adjacent to the intersection point included in the first area as the second area which has the second largest accumulation number. The area processing unit 112 may classify into the second area 702 intersection points C27-C97, other than the intersection point C17 included in the first area 701, out of the plurality of intersection points C17-C97 of the electrode X7 with the larger measurement result of the self-capacitance measurement out of the column electrode X7 and the row electrode Y1 intersecting at the intersection point C17 closest to the estimated position of the conductor object 103.

Note, the total value of the accumulation numbers of the plurality of intersection points may be always kept constant. With this, without depending on the position of a touch, the coordinate decision time is kept constant. That is, the detection accuracy of a touch is improved without impairing usability.

Note that the self-capacitance measurement unit 161 may function as a first detection unit for detecting a contact or a closeness of a conductor object with respect to any of the plurality of peripheral electrodes which are column electrodes and row electrodes arranged in a peripheral portion of the touch panel sensor out of the plurality of column electrodes and the plurality of row electrodes. Also, in a case where a contact or a closeness of the conductor object with respect to one of a plurality of the peripheral electrodes is detected, the setting unit 130 may set the accumulation number of the mutual-capacitance of each of the intersection points to be proportional to the distance from the position of the contact or the closeness of the conductor object to the respective intersection point. The mutual-capacitance measurement unit 162 may function as a second detection unit for accumulating mutual-capacitance in accordance with the accumulation number set for each of the plurality of intersection points, and detecting a contact or a closeness of the conductor object for each of the plurality of intersection points based on the accumulated mutual-capacitance. The coordinate decision unit 108 may function as a decision unit for deciding the coordinates of the conductor object based on the detection results of the second detection unit.

<Other>

Preferred embodiments of the present invention are explained above, but the present invention is not limited to these embodiments and various variations and modifications are possible within the scope of their spirit.

Note, control of the touch panel driver 101 (subject of the operations of the flowchart) may be performed by single piece of hardware, or the control of the entire apparatus may be performed by distributing processing across multiple pieces of hardware.

Also, while detailed description of the present invention was given based on preferred embodiments thereof, the present invention is not limited to these specific embodiments, and various other embodiments in a scope that does not deviate from the gist of the invention are encompassed in the invention. Furthermore, the foregoing embodiments merely illustrate examples of the present invention, and it is possible to combine these embodiments as appropriate.

Also, in the foregoing embodiments, explanation was given of examples of a case in which the present invention is applied to a digital camera, but there is no limitation to this example, and it can be applied to any electronic device 800 that can use the input apparatus 100. That is, the present invention can be applied to a personal computer, a PDA (personal digital assistant), a mobile telephone terminal or portable image viewer, a printer apparatus, digital photo frame, music player, game device, electronic book reader or the like that are equipped with a display, or the like.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-202912, filed Oct. 14, 2015 which is hereby incorporated by reference herein in its entirety.

What is claimed is:

1. An input apparatus comprising:
    a touch panel sensor having a plurality of column electrodes and a plurality of row electrodes arranged to intersect the plurality of column electrodes;
    a first measurement unit configured to execute a self-capacitance measurement for each of a plurality of peripheral electrodes which are column electrodes and row electrodes arranged in a peripheral portion of the touch panel sensor out of the plurality of column electrodes and the plurality of row electrodes;
    a determination unit configured to determine whether or not any measurement result of the plurality of peripheral electrodes measured by the first measurement unit exceeds a threshold value;
    a setting unit configured to set, if any measurement result of the plurality of peripheral electrodes measured by the first measurement unit exceeds a threshold value, an accumulation number of each mutual-capacitance of a plurality of intersection points, which are formed by the plurality of column electrodes and the plurality of row electrodes intersecting, so that the accumulation number of an intersection point closer to a position of a conductor object estimated based on measurement results of the self-capacitance measurement is larger, and the accumulation number of an intersection point farther from the position of the conductor object is smaller, and set, if all of the measurement results of the plurality of peripheral electrodes measured by the first measurement unit do not exceed the threshold value, the accumulation numbers of the mutual-capacitances of each of the plurality of intersection points to be the same value;

a second measurement unit configured to execute a mutual-capacitance measurement for each of the plurality of the intersection points in accordance with the accumulation numbers set for each of the plurality of intersection points by the setting unit; and a decision unit configured to decide coordinates of the conductor object based on the measurement result of the mutual-capacitance measurement executed by the second measurement unit.

2. The input apparatus according to claim 1, wherein the setting unit sets, if any of the measurement results of the plurality of peripheral electrodes measured by the first measurement unit exceed a threshold value, respective accumulation numbers of the plurality of intersection points in accordance with respective distances to the plurality of intersection points from the position of the conductor object estimated based on the measurement result of the self-capacitance measurement.

3. The input apparatus according to claim 1, wherein the setting unit sets, if any of the measurement results of the plurality of peripheral electrodes measured by the first measurement unit exceed a threshold value, respective accumulation numbers of the plurality of intersection points, in accordance with respective distances to the plurality of intersection points from the position of the conductor object estimated based on the measurement result of the self-capacitance measurement, by adjusting weights with which the respective accumulation numbers of the plurality of intersection points are multiplied, and multiplying an initial value of the accumulation number with the weights.

4. The input apparatus according to claim 3, further comprising a conversion unit configured to convert the measurement results of the self-capacitance measurement into a contact area between the touch panel sensor and the conductor object, wherein the setting unit further adjusts the weights, which are adjusted in accordance with the distance, in accordance with the contact area of the conductor object.

5. The input apparatus according to claim 1, further comprising a classification unit configured to, if any of the measurement results of the plurality of peripheral electrodes measured by the first measurement unit exceed a threshold value, classify as a plurality of areas the plurality of intersection points in accordance with respective distances to the plurality of intersection points from the position of the conductor object estimated based on the measurement result of the self-capacitance measurement, wherein the setting unit sets an accumulation number for each area classified by the classification unit.

6. The input apparatus according to claim 5, wherein the setting unit sets the same accumulation number for intersection points belonging to the same area.

7. The input apparatus according to claim 5, wherein the classification unit classifies an area including the intersection point closest to the position of the conductor object out of the plurality of intersection points as a first area whose accumulation number is the largest.

8. The input apparatus according to claim 7, wherein the classification unit classifies an area including a plurality of intersection points adjacent to the intersection point included in the first area as a second area whose accumulation number is the second largest.

9. The input apparatus according to claim 8, wherein the classification unit classifies as the second area intersection points out of the plurality of intersection points of the electrode with the larger measurement result of the self-capacitance measurement out of the column electrode and the row electrode intersecting at the closest intersection point excluding the intersection point included in the first area.

10. The input apparatus according to claim 1, wherein a total value of the accumulation numbers of the plurality of intersection points is kept to be always constant.

11. An input apparatus comprising:
a touch panel sensor having a plurality of column electrodes and a plurality of row electrodes arranged to intersect the plurality of column electrodes;
a first detection unit configured to detect a contact or a closeness of a conductor object with respect to any of a plurality of peripheral electrodes which are column electrodes and row electrodes arranged in a peripheral portion of the touch panel sensor out of the plurality of column electrodes and the plurality of row electrodes;
a setting unit configured to, if a contact or a closeness of the conductor object with respect to one of a plurality of the peripheral electrodes is detected, set an accumulation number of a mutual-capacitance of each of a plurality of intersection points, which are formed by the plurality of column electrodes and the plurality of row electrodes intersecting, to be proportional to a distance from a position of the contact or the closeness of the conductor object to the respective intersection point;
a second detection unit configured to accumulate mutual-capacitances in accordance with the accumulation numbers set for each of the plurality of intersection points by the setting unit, and to detect a contact or a closeness of the conductor object for each of the plurality of intersection points based on the accumulated mutual-capacitances; and
a decision unit configured to decide a coordinate of the conductor object based on a detection result of the second detection unit.

12. A method of controlling a touch panel sensor having a plurality of column electrodes and a plurality of row electrodes arranged to intersect the plurality of column electrodes, the method comprising:
executing a self-capacitance measurement for each of a plurality of peripheral electrodes which are column electrodes and row electrodes arranged in a peripheral portion of the touch panel sensor out of the plurality of column electrodes and the plurality of row electrodes;
determining whether or not any measurement result of the plurality of peripheral electrodes measured by the self-capacitance measurement exceeds a threshold value;
setting, if any measurement result of the plurality of peripheral electrodes measured by the self-capacitance measurement exceeds a threshold value, an accumulation number of each mutual-capacitance of a plurality of intersection points, which are formed by the plurality of column electrodes and the plurality of row electrodes intersecting, so that the accumulation number of an intersection point closer to a position of a conductor object estimated based on measurement results of the self-capacitance measurement is larger, and the accumulation number of an intersection point farther from the position of the conductor object is smaller, and setting, if all of the measurement results of the plurality of peripheral electrodes measured by the self-capacitance measurement do not exceed the threshold value, the accumulation numbers of each of the plurality of intersection points to be the same value;

executing a mutual-capacitance measurement for each of the plurality of the intersection points in accordance with the accumulation numbers set for each of the plurality of intersection points; and deciding a coordinate of the conductor object based on a measurement result of the mutual-capacitance measurement.

13. A computer program stored in a non-transitory computer readable medium for causing a processor to perform a method of controlling a touch panel sensor having a plurality of column electrodes and a plurality of row electrodes arranged to intersect the plurality of column electrodes, the method comprising:

executing a self-capacitance measurement for each of a plurality of peripheral electrodes which are column electrodes and row electrodes arranged in a peripheral portion of the touch panel sensor out of the plurality of column electrodes and the plurality of row electrodes;

determining whether or not one of measurement results of the plurality of peripheral electrodes measured by the self-capacitance measurement exceeds a threshold value;

setting, if any measurement result of the plurality of peripheral electrodes measured by the self-capacitance measurement exceeds a threshold value, an accumulation number of each mutual-capacitance of a plurality of intersection points, which are formed by the plurality of column electrodes and the plurality of row electrodes intersecting, so that the accumulation number of an intersection point closer to a position of a conductor object estimated based on measurement results of the self-capacitance measurement is larger, and the accumulation number of an intersection point farther from the position of the conductor object is smaller, and setting, if all of the measurement results of the plurality of peripheral electrodes measured by the self-capacitance measurement do not exceed the threshold value, the accumulation numbers of each of the plurality of intersection points to be the same value;

executing a mutual-capacitance measurement for each of the plurality of the intersection points in accordance with the accumulation numbers set for each of the plurality of intersection points; and deciding a coordinate of the conductor object based on a measurement result of the mutual-capacitance measurement.

14. An electronic device including an input apparatus and an execution unit configured to execute processing in accordance with a coordinate of a conductor object inputted from the input apparatus, wherein the input apparatus comprises:

a touch panel sensor having a plurality of column electrodes and a plurality of row electrodes arranged to intersect the plurality of column electrodes;

a first measurement unit configured to execute a self-capacitance measurement for each of a plurality of peripheral electrodes which are column electrodes and row electrodes arranged in a peripheral portion of the touch panel sensor out of the plurality of column electrodes and the plurality of row electrodes;

a determination unit configured to determine whether or not any measurement result of the plurality of peripheral electrodes measured by the first measurement unit exceeds a threshold value;

a setting unit configured to set, if any measurement result of the plurality of peripheral electrodes measured by the first measurement unit exceeds a threshold value, an accumulation number of each mutual-capacitance of a plurality of intersection points, which are formed by the plurality of column electrodes and the plurality of row electrodes intersecting, so that the accumulation number of an intersection point closer to a position of a conductor object estimated based on measurement results of the self-capacitance measurement is larger, and the accumulation number of an intersection point farther from the position of the conductor object is smaller, and set, if all of the measurement results of the plurality of peripheral electrodes measured by the first measurement unit do not exceed the threshold value, the accumulation numbers of the mutual-capacitances of each of the plurality of intersection points to be the same value;

a second measurement unit configured to execute a mutual-capacitance measurement for each of the plurality of the intersection points in accordance with the accumulation numbers set for each of the plurality of intersection points by the setting unit; and a decision unit configured to decide coordinates of the conductor object based on the measurement result of the mutual-capacitance measurement executed by the second measurement unit.

15. A method of controlling an electronic device comprising or connected to a touch panel sensor having a plurality of column electrodes and a plurality of row electrodes arranged to intersect the plurality of column electrodes, the method comprising:

executing a self-capacitance measurement for each of a plurality of peripheral electrodes which are column electrodes and row electrodes arranged in a peripheral portion of the touch panel sensor out of the plurality of column electrodes and the plurality of row electrodes;

determining whether or not any measurement result of the plurality of peripheral electrodes measured by the self-capacitance measurement exceeds a threshold value;

setting, if any measurement result of the plurality of peripheral electrodes measured by the self-capacitance measurement exceeds a threshold value, an accumulation number of each mutual-capacitance of a plurality of intersection points, which are formed by the plurality of column electrodes and the plurality of row electrodes intersecting, so that the accumulation number of an intersection point closer to a position of a conductor object estimated based on measurement results of the self-capacitance measurement is larger, and the accumulation number of an intersection point farther from the position of the conductor object is smaller, and setting, if all of the measurement results of the plurality of peripheral electrodes measured by the self-capacitance measurement do not exceed the threshold value, the accumulation numbers of each of the plurality of intersection points to be the same value;

executing a mutual-capacitance measurement for each of the plurality of the intersection points in accordance with the accumulation numbers set for each of the plurality of intersection points deciding coordinates of the conductor object based on a measurement result of the mutual-capacitance measurement; and executing processing in accordance with the coordinates of the conductor object.

\* \* \* \* \*